United States Patent [19]
Verlinden et al.

[11] Patent Number: 5,561,027
[45] Date of Patent: Oct. 1, 1996

[54] METHOD AND APPARATUS FOR MAKING A LITHOGRAPHIC OFFSET PLATE BY THE SILVER SALT DIFFUSION TRANSFER PROCESS

[75] Inventors: Bartholomeus Verlinden, Tongeren; Bert Vackier, 's-Gravenwezel; Jan Claes, Mortsel; Bart Verhoest, Wilrijk, all of Belgium

[73] Assignee: AGFA-GEVAERT N.V., Mortsel, Belgium

[21] Appl. No.: 438,847

[22] Filed: May 11, 1995

[30]     Foreign Application Priority Data

May 25, 1994 [EP] European Pat. Off. .............. 94201473

[51] Int. Cl.$^6$ ................. G03C 8/32; G03C 8/06; G03F 7/07
[52] U.S. Cl. ................. 430/204; 430/248; 396/604
[58] Field of Search ................. 430/204, 248; 354/317

[56] References Cited

U.S. PATENT DOCUMENTS

| | | | |
|---|---|---|---|
| 3,589,261 | 6/1971 | Krikelis | 95/89 |
| 4,142,194 | 2/1979 | Hamlin | 354/318 |
| 4,853,727 | 8/1989 | Ganzke et al. | 354/317 |
| 5,273,858 | 12/1993 | Coppens et al. | 430/204 |
| 5,449,585 | 9/1995 | Coppens et al. | 430/204 |

*Primary Examiner*—Richard L. Schilling
*Attorney, Agent, or Firm*—Brumbaugh, Graves, Donohue & Raymond

[57]    ABSTRACT

A method and apparatus for making an offset printing plate according to the silver salt diffusion transfer process comprises the step of washing the imaging element by applying a curtain of an aqueous medium onto the surface of the element at its silver halide emulsion layer side, across the width of the element, substantially transverse to its processing direction, and in countercurrent to the processing direction of the element.

4 Claims, 6 Drawing Sheets

METHOD AND APPARATUS FOR MAKING A LITHOGRAPHIC OFFSET PLATE BY THE SILVER SALT DIFFUSION TRANSFER PROCESS

FIELD OF THE INVENTION

The present invention relates to an apparatus and a method for the processing of photographic sheet materials and particularly for processing such materials according to the silver salt diffusion transfer process for producing a lithographic offset printing plate.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an informationwise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset imaging elements exist. According to a first type disclosed in e.g. U.S. Pat. No. 4,722,535 and GB- 1,241,661 a support is provided in the order given with a silver halide emulsion layer and a layer containing physical development nuclei serving as the image-receiving layer. After informationwise exposure and development, the imaged element is used as a printing plate without the removal of the emulsion layer.

According to a second type of mono-sheet DTR offset imaging element a hydrophilic support, mostly anodized aluminium, is provided in the order given with a layer of physical development nuclei and a silver halide emulsion layer. After informationwise exposure and development, the imaged element is washed with water to remove the emulsion layer so that a support carrying a silver image is left wich is used as a printing plate. Such type of lithographic printing plate is disclosed e.g. in U.S. Pat. No. 3,511,656.

EP-A-410500 discloses an imaging element containing a support provided with an image receiving layer and a silver halide emulsion. In said document is disclosed a diffusion transfer reversal process for obtaining a lithographic printing plate in which said imaging element is imagewise exposed and subsequently developed using a developing liquid or activating liquid in the presence of a silver halide complexing agent. The imaging elemnt is then guided through a diffusion transfer zone so that the silver halide complexes formed during the development step are allowed to diffuse into the image receiving layer where they are converted to silver. When the imaging element leaves the diffusion transfer zone a silver image is formed in the image receiving layer. Hereafter, the imaging element passes a washing and a rinsing station to remove the silver halide emulsion layer so that the silver image is exposed. Finally the imaging element, now carrying a silver image on its surface, is treated with a finishing liquid that contains a so called hydrophobizing agent for improving the hydrophobicity of the silver image.

However, said washing requires several precautions, as e.g. a gently or softly washing of the developed monosheet layer assemblage alone is not sufficient to remove the now superfluous emulsion layers from the imaging element, but a certain mechanical force is required.

Therefor, sometimes brushes, sponges, scrapers or squeegee blades, wiping or scrubbing rollers, etc are applied—either individually or separately, or in combination together-, but these elements can damage the image, especially in case of high resolution images.

According to the state of the art relating to the present invention, several attempts have been made of using a spray in a washing station of a processing apparatus.

U.S. Pat. No. 3,589,261 applies in a washing station at the entrance a first spray which gives a hard scrubbing action to the surface of the element and at its exit a second spray which gives a light rinsing action to the element.

In U.S. Pat. No. 4,142,194 a rinsing section comprises water impact sprays and barrier means (e.g. a wiper) extending longitudinally of the upper drive roller.

The apparatus "Silverlith", e.g. processor SLT, marketed by Du Pont, comprises a washing section and a rinsing section. In the washing section warm water is dripping out of a tube, without any substantial pressure, on an upper drive roller, which is a scrub roller, as well as on the element. In the rinsing section, water is sprayed on the element which is passed below a squeegee set to remove the water of the element.

The use of common sprays or jets tends to damage the image on the imaging element, or tends to cause clogging of pumps, valves and filters by fragments of the layers removed from the imaging element after its development, both phenomena being detrimental to image quality.

OBJECT OF THE INVENTION

It is an object of the present disclosure to provide an alternative and improved method for washing lithographic offset printing plates according to the DTR-process.

It is a further object of the present invention to provide an alternative method for obtaining lithographic offset printing plates according to the DTR-process with improved printing properties.

It is a further object of the present invention to provide an alternative apparatus for obtaining lithographic offset printing plates according to the DTR-process with improved printing properties.

Further objects and advantages will become apparant from the description given hereinbelow.

SUMMARY OF THE INVENTION

According to the present invention, there is provided a method for making an offset printing plate according to the silver salt diffusion transfer process comprising the steps of:

informationwise exposing an imaging element comprising in the order given (i) a hydrophilic support, (ii) an image receiving layer containing physical development nuclei and (iii) a silver halide emulsion layer;

developing said informationwise exposed element using an aqueous alkaline processing solution in the presence of at least one developing agent and at least one silver halide solvent to obtain a silver image on said hydrophilic support;

removing said silver halide emulsion layer and any optional layer on top of said silver image to uncover said silver image by washing with an aqueous medium, wherein said washing is carried out by applying a curtain of said aqeous medium onto the surface of the element at its silver halide emulsion layer side, across the width of the element substantially transverse to its processing direction, and in countercurrent to said processing direction.

According to the present invention, there is also provided an apparatus, comprising a washing station 4 which comprises a washing chamber, a sump or tank 28 for collecting wash-solution, entrance and exit rollers 42 to 45 for transporting or processing an imaged element along a transporting or processing path 12 through the station, and at least one spraying means for applying a curtain of a wash-solution to said element, located between the entrance and the exit transport rollers and being oriented towards the processing path 12 of the element 9 at an inclined angle β to said processing path 12 in a direction 26 countercurrent to the processing direction 11 of the element.

BRIEF DESCRIPTION OF THE DRAWINGS

The present invention will be illustrated by means of the following drawings, without however the intention to limit the invention thereto.

DETAILED DESCRIPTION OF THE INVENTION

Figure 1:
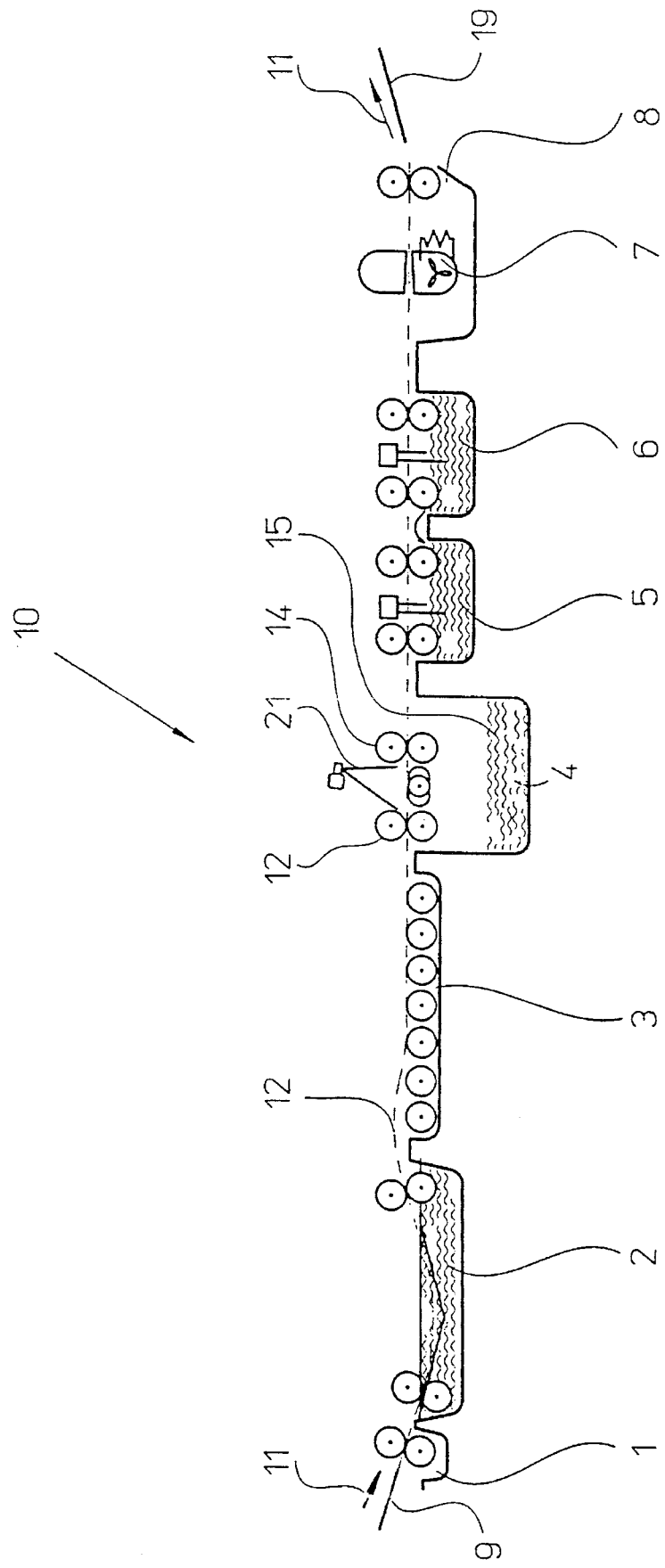
FIG. 1 is a schematic longitudinal layout of a processing apparatus according to the present invention

Reference is firstly made to FIG. 1 in which there is illustrated a longitudinal cross section through an apparatus 10 for processing exposed printing plates 19 of the type described in EP-A-410500. The apparatus 10 is mounted within a generally rectangular housing (not shown) for supporting the various parts of the apparatus. An informationwise exposed imaged element 9 is progressing in processing direction 11 along a processing path 12 by being sequentially fed through an entrance station 1, a developing station 2, a diffusion transfer station 3, a washing station 4 containing a wash-solution 15, a rinsing station 5 and a finishing station 6. After having passed a drying station 7, the printing plate 19 may then leave the apparatus 10 through the output station 8 and a lithographic printing plate 19 is obtained.

According to an embodiment of uncovering the imaged element, the developed monosheet layer assemblage is washed with an aqueous medium 15 such as water or water with an additive, sometimes also indicated as wash-solution 15 so that the now superfluous emulsion layers are removed from the element. Therefor, in washing station 4, the element is throughputted by an entrance pair 13 of rollers and subsequently washed with a solution 15 which is sprayed onto the surface of the element 9 from a washing nozzle. Washing station 4 also comprises an exit pair 14 of squeegee rollers for squeezing excessive wash-solution 15 from the surface of the element. In the absence of an element, the sprays do not touch neither the entance nor the exit roller pair, but directly flow into a tank.

Figure 2:
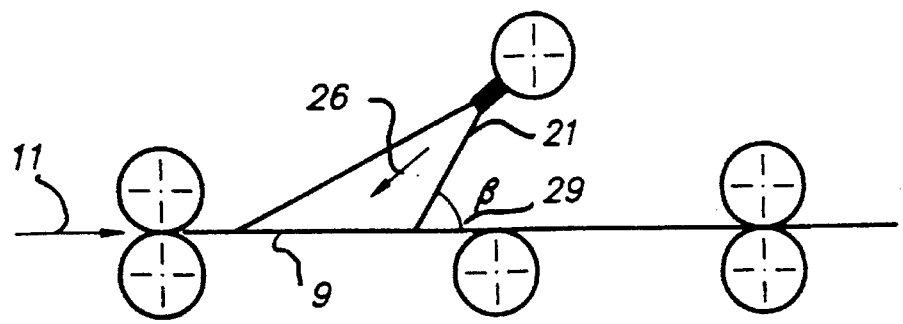
FIG. 2 is a schematic longitudinal layout of a washing station according to the present invention.

Now, first a description will be given,in reference to FIGS. 1 and 2, of the method(s) according to the present invention. In a first preferred embodiment of the present invention, a method for making an offset printing plate 19 according to the silver salt diffusion transfer process comprises the steps of:

informationwise exposing (not described in detail) an imaging element comprising in the order given (i) a hydrophilic support, (ii) an image receiving layer containing physical development nuclei and (iii) a silver halide emulsion layer;

developing (in station 2 and 3) said informationwise exposed element 9 using an aqueous alkaline processing solution in the presence of at least one developing agent and at least one silver halide solvent to obtain a silver image on said hydrophilic support;

removing said silver halide emulsion layer and any optional layer on top of said silver image (in station 4) to uncover said silver image by washing with an aqueous medium 15, said washing being carried out by applying a curtain 21 of an aqueous medium 15 onto the surface of the element at its silver halide emulsion layer side, across the width of the element, substantially transverse to its processing direction 11, and in countercurrent 26 to said direction 11.

In a second preferred embodiment of the present invention, said applying of a curtain 21 of an aqueous medium 15 is carried out by spraying while transporting said element through the washing station along a processing path 12, thereby spraying either continuously or discontinuously.

Advantageously, said spraying is carried out under an inclined angle β (referral 29) to the processing path 12 (to be explained later on in the further descriptions; cfr. the later FIG. 3).

It is also of great advantage that the temperature of the aqueous medium 15 is maintained between 30° C. and 80° (also to be described later on).

Before starting with the extensive description of the apparatus in full details, it is noticed that e.g. the guidance control of the imaged element in the developing bath is disclosed in our patent application EP-A-93201305.5; that the squeegee rollers for squeezing excessive aqueous medium 15 from the surface of the element are disclosed in our patent application EP-A-93202154; that two solutions to the problem of rollers adhering together when the processing apparatus is idle are disclosed in our patent applications EP-A-92203312 and 93201957.

Figure 3:
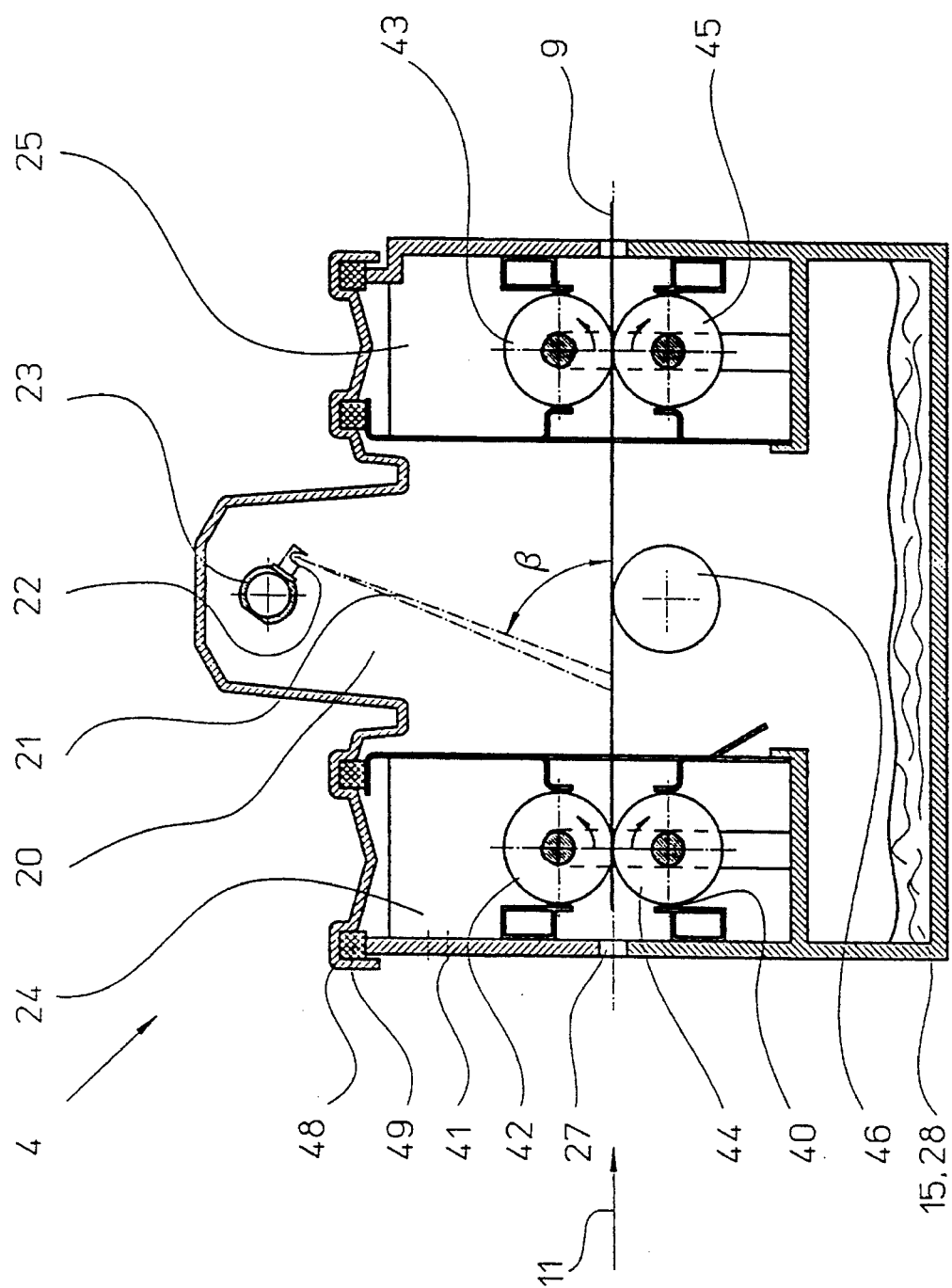
FIG. 3 is a longitudinal section through a washing station of an apparatus according to the present invention.
Figure 4:
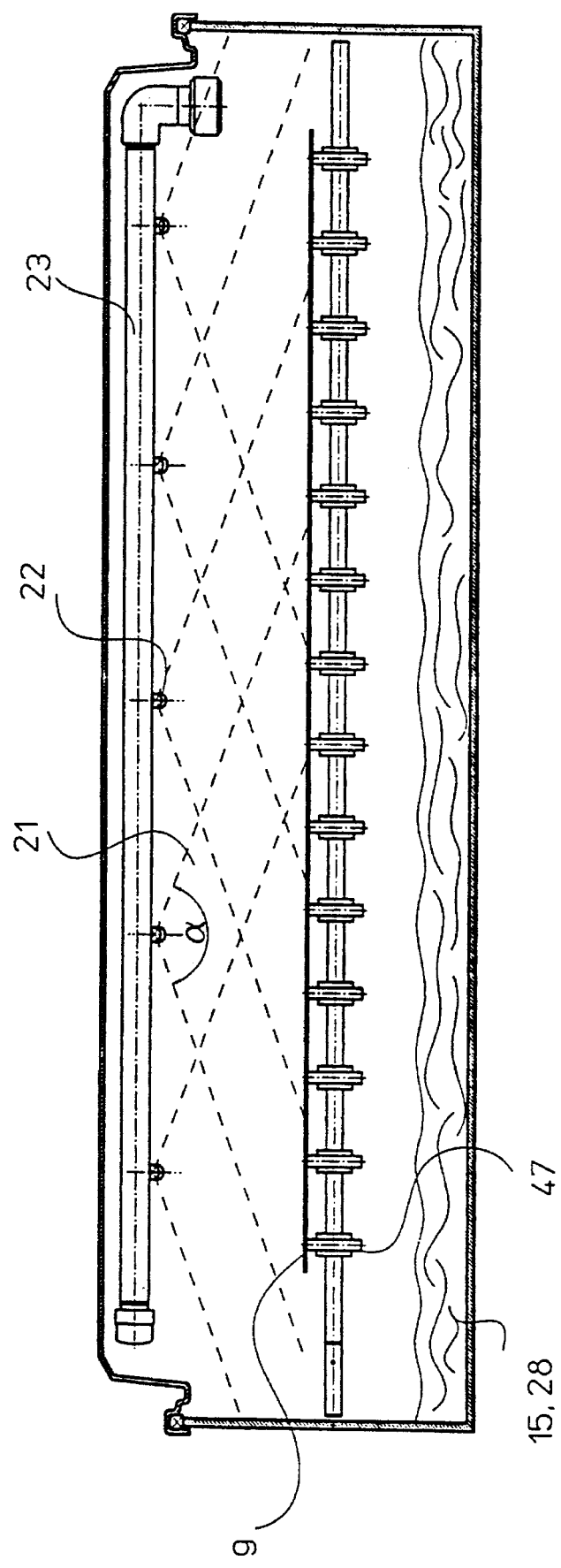
FIG. 4 is a transversal section through a washing station of an apparatus according to the present invention.

Now reference is made to FIG. 3, which is a longitudinal cross section through a washing station 4 and to FIG. 4, which is a transversal section through a washing station of an apparatus according to the present invention. As it can be seen on these figures, the developed imaging element 9 is passing along processing direction 11 under a spray curtain 21 of aqueous medium 15. The nozzles 22 on the spray heads 23 are preferably designed to ensure that droplets of solution impinge on all points on the surface of the element 9 to ensure an even coverage of the surface and the pressure of the spray curtain 21 is adjusted to ensure that spraying droplets impinge with sufficient impact to wash the element.

As shown in FIG. 3 and in FIG. 4, washing station 4 essentially comprises a washing or spraying chamber 20 and two times an antechamber 24 and 25, one at the incoming side of the spraying chamber and one at the outgoing side of the spraying chamber. More in detail, washing station 4 further advantageously comprises vertical walls 41 with suitable openings 27 for progressing the imaged element 9 into processing direction 11, a sump 28 partly filled with an aqueous medium 15, rubbered upper rollers 42, 43 and rubbered bottom rollers 44, 45 (mounted within the antechamber 24, 25) for gripping and advancing the element 9, one middle roller 46 or several middle rollers 47 which are possibly segmented middle rollers 47, a cover plate 48 and sealing means 49 to prevent solution leakage and air entrainement, as well as associated pump and temperature control means (not shown). Said middle roller 46 (or rollers 47) is (or are) arranged for engaging only the rear side of the element 9.

As a consequence of the preferably very intensive atomisation of the droplets, the air within the washing station 4 is highly saturated. By further consequence, the possible danger of leakages of aqueous medium 15 liquid to the preceding (diffusion) station 3 or to the following (rinsing) station 5, is also very high. In order to prevent possible contamination problems, special precautions are to be taken taken. It is noticed that e.g. sealing means for maintaining a liquid seal 40 between at least one roller of at least one roller pair and an adjacent wall of the washing station is disclosed in our patent application EP-A-93201957.

According to a preferred embodiment of the present invention, an apparatus for carrying out the method according to any of the preceding claims, comprises a washing station 4 which comprises a washing chamber 20, a sump or tank 28 for collecting aqueous medium, entrance and exit rollers 42 to 45 for transporting an imaged element along a processsing path 12 through the station, and at least one spraying means for applying a curtain of an aqueous medium 15 to said element, located between the entrance and the exit transport rollers and being oriented towards the silver halide emulsion layer side of said element at an inclined angle β (referral 29) to the processing path 12 in (a direction) countercurrent (referral 26) to the transporting direction 12 of the element.

In another preferred embodiment of the present invention, the washing station further comprises at least one middle roller 46 arranged for engaging the rear side only of the imaged element.

In another preferred embodiment of the present invention, said processsing path 12 is substantially horizontal and said spraying means is located above the processing path 12 of the imaged element.

In a further preferred embodiment of the present invention, the washing station 4 comprises a sump or tank 28 provided with an overflow (not shown) for maintaining the aqueous medium 15 at a level below that of the rollers in the station, and with heating means (not shown) for heating the aqueous medium 15. Further, a circulation pump (not shown) draws water from said sump 28 and pumps it to the spray heads 23. An additional pipe (not shown) is fitted to the tank at its lowest point to permit drainage.

In a still further preferred embodiment of the present invention, the washing station 4 additionally comprises a piping connection (not shown) to the water mains supply for optional replenishing fresh wash-water and means (not shown) for dosing an amount of fresh water into tank 28 during replenishment. Upon a signal from e.g. a level detector (not shown) dosing means is controlled to add a certain amount of fresh wash-water into tank.

The apparatus according to the invention comprises in principle no filters in the washing circuit, so that the reliability of operation becomes high. This is different from prior art apparatus operating with an unheated aqueous medium whereby material removed from the imaged element is present in the liquid circuit in the form of skins or flakes which can raise large problems with filtering and/or with spraying.

Figure 5:
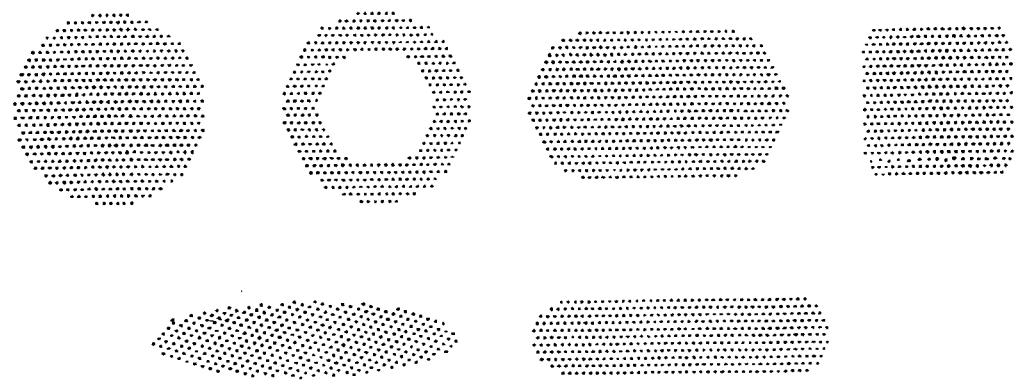
FIG. 5 gives a survey of producable spray patterns.
Figure 6A:
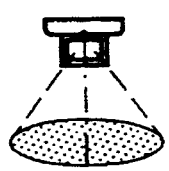
FIGS. 6a and 6b give a principal layout of two different spray nozzles each with their corresponding spray pattern.
Figure 6B:
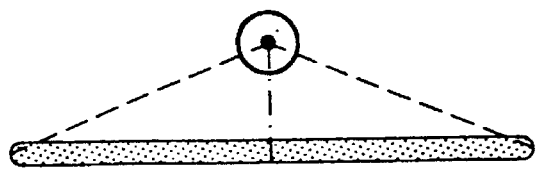
Figure 7:
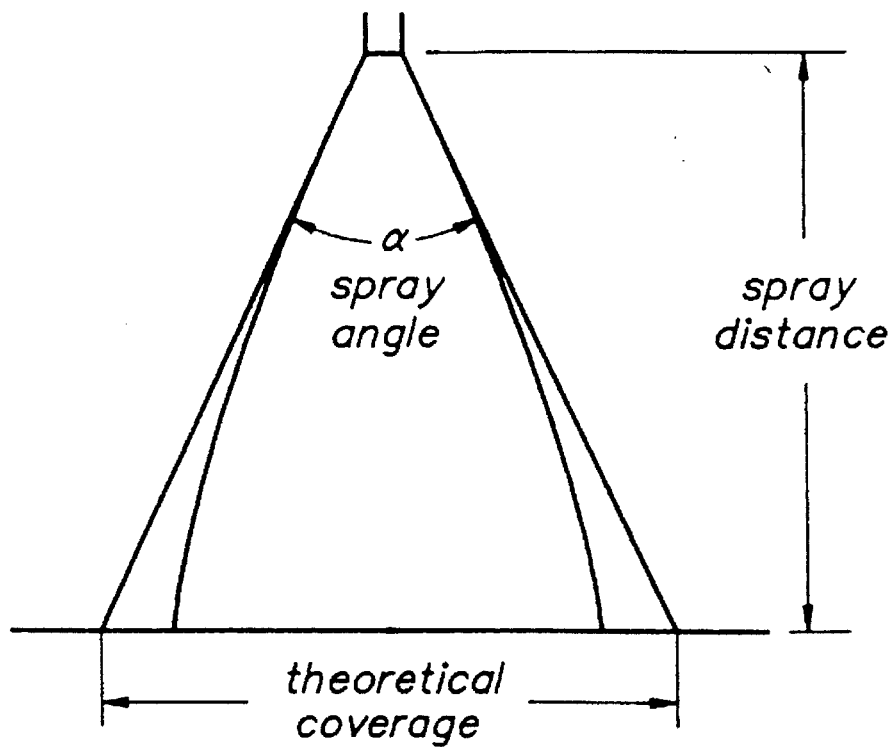
FIG. 7 illustrates the terms "spray angle α" and "theoretical coverage" of a spray nozzle.

In a further preferred embodiment of the present invention, said spraying means are spray nozzles 22. Spray nozzles 22 are usually classified as to the pattern they produce, such as hollow cone, solid cone, flat spray and square spray. Here, reference can be made to FIG. 5 which gives a survey of some producable spray patterns; to FIGS. 6a and 6b which give a principal layout of two different spray nozzles, each with their corresponding spray pattern; and to FIG. 7, which illustrates the term "theoretical coverage" of a spray nozzle.

Whereas the shape of the spray pattern is controlled by the geometry of the nozzle, the output of the spray nozzles 22 depends on the diameter of the nozzle and the hydraulic pressure at the outlet of the nozzle, further indicated as "nozzle pressure".

A wide variety of nozzles are available and by selection of nozzle size and by controlling the nozzle pressure an almost infinite variety and combination of outputs can be obtained.

The size and shape of the spray nozzles and the nozzle pressure are parameters which can be adjusted to ensure an even coverage of the surface of the imaged element 9 and enough force or impact of the spray droplets. The flow rate (or capacity) from the spray nozzles can be accurately controlled by controlling the pressure at the nozzles. This is achieved by using sensitive pressure regulating valves or other devices (not shown for reason of simplicity).

Figure 8A:
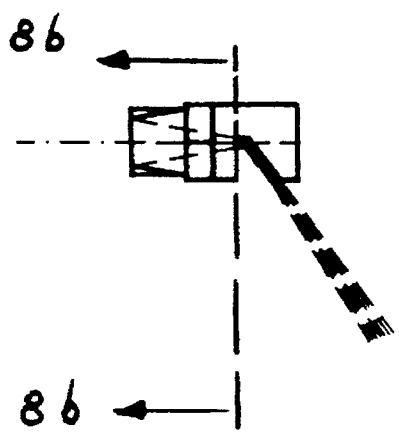
FIGS. 8a and 8b give a front view and a right side view respectively of a spray nozzle of a flat spray type.
Figure 8B:
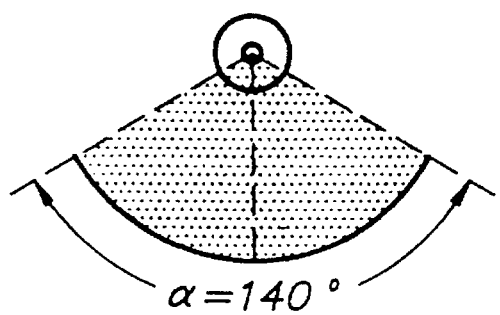

In another preferred embodiment of the present invention, the nozzles have a spray angle α (defined in FIG. 7 and further indicated in FIGS. 4 and 8a and 8b) of a spray nozzle situated between 100° and 150° and wherein the spray curtain 21 has an inclined angle β (also indicated with referral 29 and figurated in FIGS. 2 and 3) situated between 45° and 80°.

In another preferred embodiment of the present invention, the aqueous medium 15 is sprayed with a common pressure at the nozzle ranging from 0.5 bar to 2.0 bar and with a global capacity (or total flow) ranging from 20 liters pro minute to 40 l/min.

In one preferred embodiment of the present invention, the spraying means comprises at least one spray nozzle.

Preferrably, the spray nozzle is a nozzle flat spray type (see FIG. 8) Floodjet K12 or K10 or K15, made by Spraying Systems Co., North Avenue at Schmale Road, Wheaton, Ill.—U.S.A.

In another preferred embodiment of the present invention, the spraying means comprises a plurality of spray nozzles 22 spaced from one another. Herein, the spray nozzles are spaced in at least one single row across the width of the imaged element transverse to the processing direction of the element. This arrangement is particularly suited for obtaining an abundant supply of aqueous medium.

Figure 9:
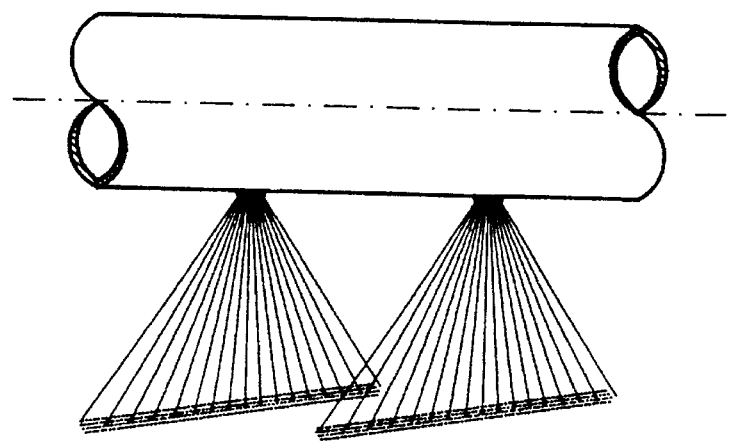
FIG. 9 gives a perspective view of one embodiment according to the present invention with "offsetted" spray nozzles.
Figure 10:
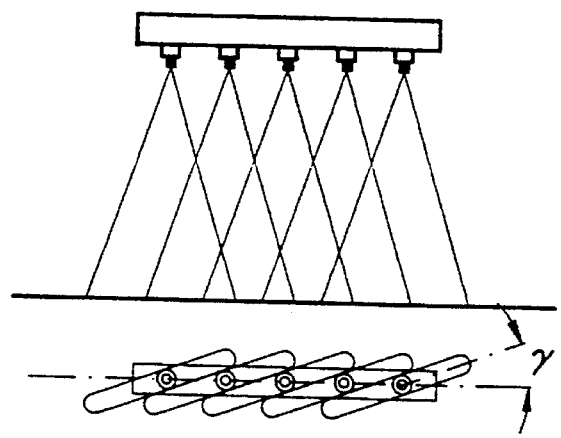
FIG. 10 gives a front view and an upper view of an embodiment according to FIG. 9.

According to a further embodiment, the nozzles are arranged in a row across the width of the imaged element with an offset angle γ between 1° and 10° to a transverse to the processing direction of the element, thereby producing a plurality of partial spray curtains. FIG. 9 gives a perspective view of one embodiment according to the present invention with "offsetted" spray nozzles, whereas FIG. 10 gives a front view and an upper view of an embodiment according to FIG. 9.

Some of the advantages resulting from using an offset angle γ are that the spray of aqueous medium impinges not only in countercurrent, but also comprises a lateral component, so that the uncovered layer flows away more easily, that no accumulation of wash-water on the imaged element takes place, that no impingement force is reduced by any accumulation of wash-water on the element, and that any interference with adjacent sprays can be avoided.

Figure 11:
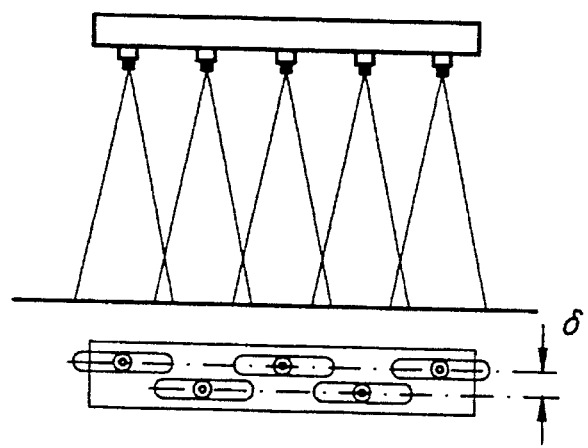
FIG. 11 gives a front view and an upper view of another embodiment according to the present invention with "intervalled-parallel" rows of spray nozzles.

In another embodiment of the present invention the nozzles are spaced in some "intervalled-but parallel" rows across the width of the imaged element with an offset distance δ between 1 and 15 mm transverse to the processing direction of the element, thereby producing a plurality of partial spray curtains. FIG. 11 gives a front view and an upper view of another embodiment according to the present invention with "intervalled-parallel" rows of spray nozzles.

Therabove, it is important that the rate of application of the aqueous medium 15 be controlled within a predetermined range of flow rates being related to the rate of passage of the imaged element through the apparatus 10. It is also important that the temperature and the nozzle pressure of the aqueous medium 15 are maintained accurately at their appropriate levels.

Another preferred embodiment of the present invention, further comprises recirculation means (not shown) for collecting and recirculating the aqueous medium 15 to the spraying means.

Another preferred embodiment of the present invention, further comprises replenishing means (not shown) for replenishing the sump 28 of the washing station 4 with a predetermined amount of fresh wash-liquid.

Still another preferred embodiment of the present invention, further comprises a reservoir (not shown) for holding an antibacterium and dosing means for dosing a predetermined amount of said antibacterium into the sump 28 of the washing station 4. Preferably, said antibacterium comprises a liquid with a pH between 10 and 13.5.

Still another preferred embodiment of the present invention, comprises a developing station 2, a diffusion transfer station 3, a rinsing station 5 and a finishing station 6.

According to the present invention, prefeably nozzles with relatively large openings so that there is no risk for the nozzles to become clogged by particles in the aqueous medium 15 that is received from the tank and returned to the spray nozzles.

Thus included in the present invention is a suitable automatically operated apparatus for processing lithographic offset printing plates according to a silver complex diffusion transfer reversal process, wherein a washing station as described hereabove is integrated.

Using a spray enables successful development of higher resolution images and also offer cost saving advantages because the omission of brushes and wiping rollers not only reduces the initial manufacturing cost but also the maintenance cost.

According to a preferred embodiment of the present invention, a centrigugal pump is used. However, other types of hydraulic pumps might be applied, e.g. piston, membrane, gear or screw type pumps.

In selecting the type of pump cost, efficiency, and maintenance generally are the governing factors in making a final selection.

The present invention clearly can be applied in the case of processing materials which are suitable to produce a lithographic offset printing plate by the silver salt diffusion transfer process, but can also be applied in the case of processing other photographic sheet materials.

Of course, many modifications are possible in the arrangement of this invention.

We claim:

1. A method for making an offset printing plate according to the silver salt diffusion transfer process comprising the steps of:

informationwise exposing an imaging element comprising in the order given (i) a hydrophilic support, (ii) an image receiving layer containing physical development nuclei and (iii) a silver halide emulsion layer;

developing said informationwise exposed element using an aqueous alkaline processing solution in the presence of at least one developing agent and at least one silver halide solvent to obtain a silver image on said hydrophilic support; and removing said silver halide emulsion layer and any optional layer on top of said silver image to uncover said silver image by washing with an aqueous medium, characterised in that said washing is carried out by applying a curtain of an aqueous medium onto the surface of the element at its silver halide emulsion layer side, across the width of the element, substantially transverse to its processing direction, in countercurrent to the processing direction of the element and applied by spraying.

2. A method according to claim 1, wherein said spraying is carried out continuously or discontinuously while transporting said element through the washing station along a processing path.

3. A method according to claim 1, wherein said spraying is carried out under an inclined angle β to the processing path.

4. Method according to claim 1, wherein the temperature of the aqueous medium is between 30° C. and 80°.

\* \* \* \* \*